United States Patent [19]
Bitts

[11] Patent Number: 5,406,208
[45] Date of Patent: Apr. 11, 1995

[54] METHOD AND APPARATUS FOR ELIMINATING CHIPS IN A CHIP DETECTION CIRCUIT AND FOR DETERMINING CHIP SIZE

[75] Inventor: Doanld R. Bitts, Grand Prairie, Tex.

[73] Assignee: Benz Companies, Inc., Fort Worth, Tex.

[21] Appl. No.: 33,574

[22] Filed: Mar. 18, 1993

Related U.S. Application Data

[63] Continuation-in-part of Ser. No. 886,620, May 21, 1992, Pat. No. 5,250,909.

[51] Int. Cl.⁶ .......................................... G01R 31/00
[52] U.S. Cl. .................................. 324/537; 324/710; 219/68; 180/338; 364/424.04; 364/184
[58] Field of Search ............. 324/537, 555, 71.1, 324/710; 219/68; 180/338; 364/424.03, 424.04, 474.04, 474.17, 184

[56] References Cited

U.S. PATENT DOCUMENTS

| | | | |
|---|---|---|---|
| 2,429,920 | 10/1947 | Bourne, Jr. | 340/631 |
| 2,450,630 | 10/1948 | Bourne, Jr. | 200/61.09 |
| 3,193,815 | 7/1965 | Prestel | 340/627 |
| 3,259,729 | 7/1966 | Mürtz et al. | 219/68 |
| 3,432,750 | 3/1969 | Botstiber | 324/439 |
| 3,622,882 | 11/1971 | Gardner | 324/158 MG |
| 3,629,816 | 12/1971 | Gillund | 180/271 |
| 3,825,307 | 7/1974 | Carr et al. | 303/92 |
| 3,955,183 | 5/1976 | McBrian | 340/514 |
| 3,963,981 | 6/1976 | Vis | 324/510 |
| 4,001,818 | 1/1977 | Radichel et al. | 340/520 |
| 4,070,660 | 1/1978 | Tauber | 340/631 |
| 4,086,570 | 4/1978 | Wakasa et al. | 340/825.77 |
| 4,166,243 | 8/1979 | West et al. | 324/537 |
| 4,219,805 | 8/1980 | Magee et al. | 340/631 |
| 4,667,187 | 5/1987 | Volk et al. | 340/641 |
| 4,728,898 | 3/1988 | Staley, Jr. | 324/522 |
| 4,783,631 | 11/1988 | Nakashima et al. | 324/538 |
| 4,785,235 | 11/1988 | Hendricks et al. | 324/537 X |
| 4,845,435 | 7/1989 | Bohan, Jr. | 324/537 |
| 4,931,949 | 6/1990 | Hernandez et al. | 364/474.17 X |
| 5,045,840 | 9/1991 | Berrier et al. | 340/652 |
| 5,250,909 | 10/1993 | Bitts | 324/542 |

Primary Examiner—Kenneth A. Wieder
Assistant Examiner—Glenn W. Brown
Attorney, Agent, or Firm—Geoffrey A. Mantooth

[57] ABSTRACT

A chip detector is an open circuit device that attract metal chips circulating throughout a piece of equipment such as a transmission. If a chip closes the circuit in the chip detector, then it is subjected to a first pulse of energy in an attempt to burn or displace it from the chip detector contacts. The energy content of the first pulse is selected to burn fuzz, which represents chips of an acceptable size. If the chip remains in the chip detector, then it is subjected to one or more additional pulses each having a greater energy content than the first pulse. The number of pulses and their energy contents are recorded to determine the size of the chips captured by the chip detector and to provide a history of the equipment being monitored. If the chip in the chip detector exceeds a predetermined threshold, then an indication is given on a user interface.

16 Claims, 10 Drawing Sheets

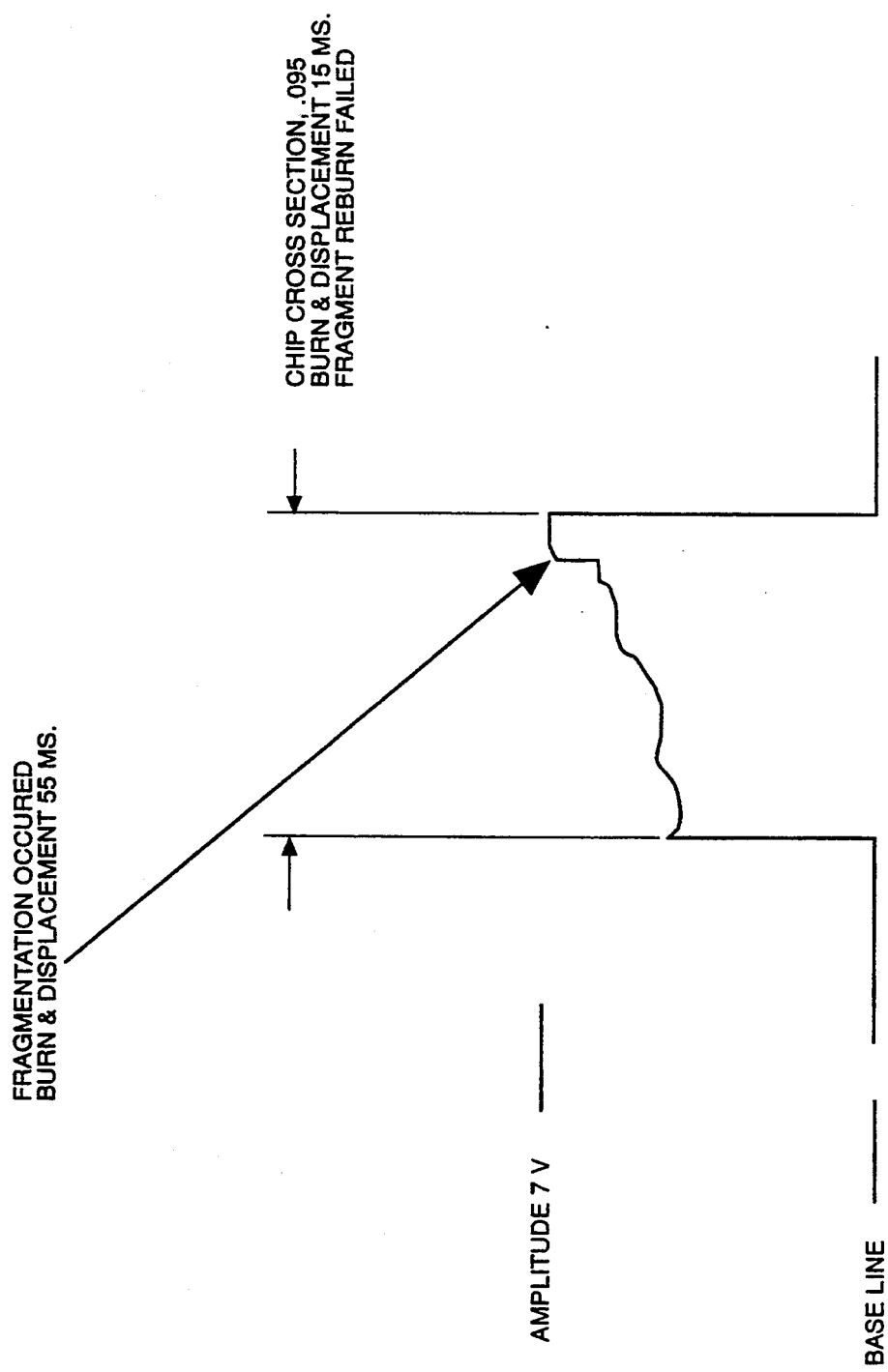

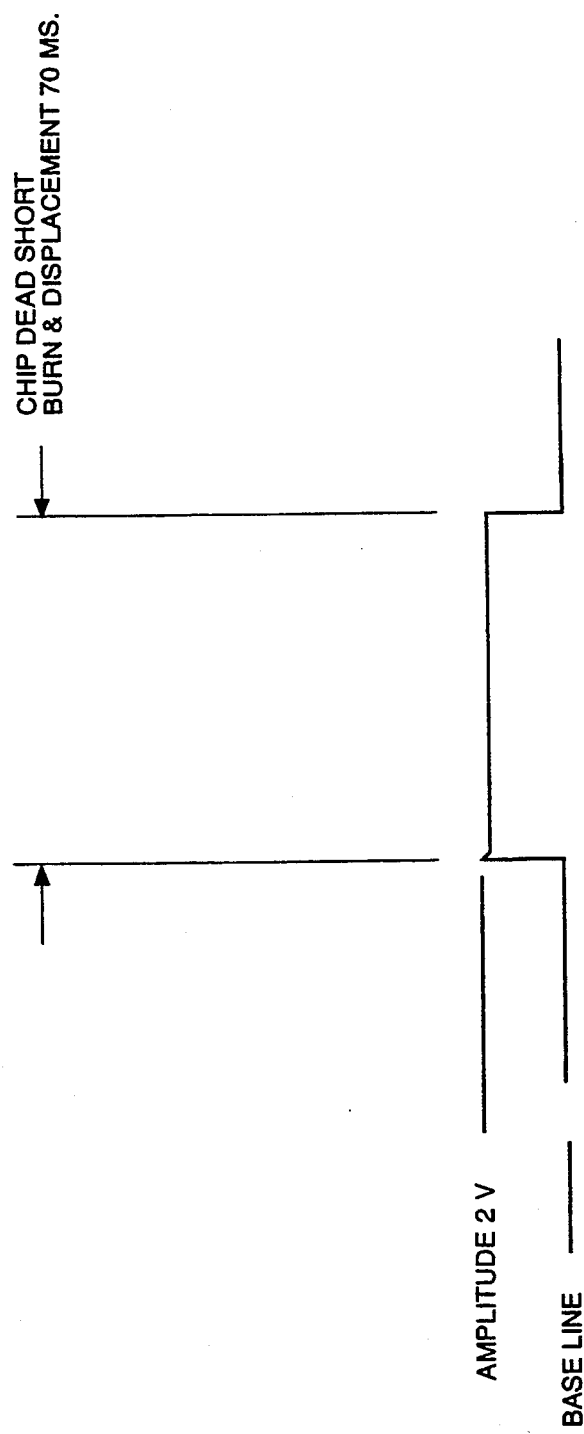

METHOD AND APPARATUS FOR ELIMINATING CHIPS IN A CHIP DETECTION CIRCUIT AND FOR DETERMINING CHIP SIZE

This application is a continuation-in-part of application Ser No. 07/886,620, filed May 21, 1992, now U.S. Pat. No. 5,250,909.

FIELD OF THE INVENTION

The present invention relates to methods and apparatuses for monitoring chips in chip detection circuits.

BACKGROUND OF THE INVENTION

Helicopters are equipped with many sensors that advise the pilot of the condition of various onboard systems. There are normally open sensors, which close the circuit when the sensor is activated, and normally closed sensors, which open the circuit when activated. The sensors are connected to indicators such as warning lights on the pilot's instrument panel. The sensor is typically located remote from the indicator. Therefore, the electrical connections typically pass through several harnesses, junction boxes, terminal boards, etc.

An example of a normally open sensor is a chip detector. A chip detector is used to monitor the health or air worthiness of a helicopter's transmission or gear box, which is a vital piece of equipment. The presence of a significant number of metal chips in the transmission fluid usually indicates mechanical problems with the transmission. The chip detector is partially immersed in the transmission fluid so as to be exposed to the metal chips circulating inside of the fluid. The chip detector is provided with a magnet so as to attract and retain the metal chips. The presence or absence of metal chips captured by the chip detector is indicated both visually and electrically. The electrical indication is provided by a warning light on the instrument panel. If metal chips accumulate during flight, the warning light is illuminated and the pilot can safely land the helicopter, before the rotors lock up.

The visual indication is provided between flights by a ground mechanic. The mechanic physically removes the chip detector from the transmission, visually inspects the collection area on the chip detector for metal chips, and then reinstalls the chip detector into the transmission. A visual inspection of the chip detector is required after the helicopter is flown for a specified number of hours. (In Canada, the chip detector is required to be visually inspected every day.)

Several problems can and have arisen due to the frequent removal and installation of chip detectors. Because the chip detector is in contact with transmission fluid, failure to properly reinstall the chip detector could result in a loss of fluid during flight. In fact, this very problem occurred in a helicopter flying over the Gulf of Mexico. The loss of transmission fluid during flight resulted in a forced landing of the helicopter on the water. One of the flotation devices on the helicopter failed, resulting in the helicopter flipping over and sinking.

Thus, with the required frequent handling of the chip detector component of the transmission, the possibility for loss of life or aircraft due to human error is significant. The electrical indication circuit provides no clue as to improper installation of an open circuit sensor such as a chip detector. What is needed is a system for detecting the improper installation of a chip detector.

Another problem caused by frequent handling of the chip detector is broken wires. Wires lead from the chip detector to the warning light in the cockpit instrument panel. These wires can be easily broken as the chip detector is handled during the visual inspection process. A broken wire results in the disablement of the electric circuit. In the prior art, there is Berrier, et al., U.S. Pat. No. 5,045,840, owned by the assignee of the present invention. Berrier, et al. provides a continuity sensor that can be installed across an open circuit device such as a chip detector. Upon the application of power to the circuit in the cockpit, the continuity sensor temporarily closes the circuit to illuminate the warning light. If the warning light illuminates, the interconnections leading from the warning light to the chip detector are in working order. However, if the warning light fails to illuminate, then the chip detector circuit is inoperable.

The Berrier, et al. continuity sensor has proven to be a noteworthy and much needed device. Before the Berrier, et al. continuity sensor, prior art electrical sensing circuits with normally open sensors were vulnerable to open circuit faults. With the Berrier continuity sensor, such open circuit faults can be identified and corrected.

It is desired to supplement the Berrier, et al. continuity sensor to, as mentioned above, detect if a chip detector has been improperly installed. In addition, it is desired to provide a system to monitor the continuity of wires leading to the chip detector on a continuous basis. Furtherstill, it is desired to provide a system to monitor the electrical status of the chip detector or other open circuit sensor so as to detect degradation of the contacts.

By virtue of its magnetic field, a chip detector installed in a transmission attracts chips of all sizes. Much of the metallic chips that are attracted to and retained by the chip detector are referred to as fuzz by the aircraft industry. This fuzz is produced by normal wear of components and represents no danger to the helicopter or aircraft. New transmissions and engines in particular produce relatively large amounts of fuzz during their break-in periods. This fuzz builds up in the chip detector, causing a short across the contacts of the chip detector. Thus, the fuzz is detected by the chip detector in the same manner as are larger chips.

Ideally, the chip detector would only detect the presence of large chips. These large chips indicate that the piece of equipment that is being monitored has internal components that are failing and therefore a catastrophic failure of the equipment is possibly imminent.

The problem then is how to distinguish between the relatively harmless fuzz and the larger size chips, which indicate a problem with the equipment being monitored. One way is to pull the chip detector out of its hole and visually inspect it to determine the size of the chips. But, as discussed above, this causes more problems (in the form of a broken wire or potential loss of transmission fluid if the chip detector is incorrectly reinstalled) than it solves. Also, visual inspections are unwise during flight.

There is a real need for a device that allows a pilot, during flight, to verify if the chip detector has detected large chips or just nuisance fuzz. Too many false alarms caused by nuisance fuzz degrades the effectiveness of the chip detector system, as a pilot is more likely to attribute a chip indication to just another false alarm.

In the prior art, there is Tauber, U.S. Pat. No. 4,070,660, which shows an electrical circuit that burns off the fuzz. A capacitor is connected across the chip detector contacts. When no chips are present in the chip detector, the capacitor charges to a voltage. When a chip enters the chip detector, the capacitor discharges through the chip. The idea is that the energy provided by the discharging capacitor will heat and burn away the unwanted fuzz, while leaving the larger chips, which require detection, in the chip detector. The use of electrical current to burn away small sized chips relies on the phenomenon of resistive heating. As current is passed through the chip, the resistance in the chip causes heating. It is hoped that the temperature increases to the point of melting or burning the chip.

The problem of the Tauber fuzz burner is its unreliability. This is due to the nature of the energy provided by a discharging capacitor. A capacitor discharges exponentially, with the peak discharge current through the chip occurring at the beginning of the discharge. Thus, the peak energy is delivered to the chip at the beginning of the discharged. In practice, this produces instantaneous power at the points of contact between the chip and the chip detector, resulting in welding the chip to the contacts. Thus, instead of burning fuzz away from the contacts of a chip detector, the Tauber device does just the opposite.

Furthermore, the contacts of the chip detector are immersed in oil circulating through the transmission. This immersion is necessary, as it exposes the contacts to the chips. However, the oil acts as a heat sink around the chips. This requires more energy to burn away a particular chip than if the chip was simply surrounded by air. The prior art capacitor circuit is often unable to deliver sufficient energy to burn away fuzz immersed in the oil.

SUMMARY OF THE INVENTION

It is an object of the present invention to provide a method and apparatus that eliminates fuzz from a chip detector in a reliable and controlled manner.

Another object of the present invention is to provide a method and apparatus that automatically acquires information on the sizes of chips in a chip detector.

The present invention provides an apparatus for eliminating chips from a chip detector. The apparatus includes means for detecting when a chip is in a chip detector and means for producing plural pulses responsive to the detecting means. The plural pulses include first and second pulses. The first pulse has a different energy content than the second pulse. The means for producing plural pulses has timing means for causing the production of the first pulse first, followed by the second pulse if the chip is still in the chip detector after the first pulse.

In one aspect of the present invention, the apparatus further includes means for determining the size of the chip based upon the energy content of the pulses that are produced. In still another aspect, there is a means for recording the pulses that the chip was subjected to. In still another aspect, the means for producing plural pulses includes means for varying durations of the pulses such that the first pulse has a first duration and the second pulse has a second duration.

The present invention also provides a method for eliminating and monitoring the presence of chips in a chip detector. The method detects when a chip is in the chip detector. The chip is subjected to a first pulse of energy and a determination is made if the chip has suffered burning or displacement as a result of the first pulse. If the chip has not suffered burning or displacement as a result of the first pulse, then the chip is subjected to a second pulse of energy that has a different amount of energy than the first pulse. A determination is made if the chip has suffered burning or displacement as a result of the second pulse. The approximate size of the chip is determined from the amount of energy required to burn or displace the chip.

The present invention is able to determine the sizes of chips that are collected by a chip detector. Knowing the size of chips allows the determination of the overall air worthiness or operational readiness of a piece of equipment that is being monitored. If the equipment produces small chips, or fuzz, within a tolerance determined by the manufacturer, then the equipment can remain in service. The present invention provides quantitative data on the size of chips, thereby reducing the number of false alarms to the pilot or maintenance personnel. Also, the present invention burns away the fuzz, thereby cleaning the chip detector. If the equipment produces large chips, a serious and potentially dangerous situation, then the pilot is notified in real time by a display on the instrument panel.

The present invention is able to provide quantitative information on the sizes of chips by subjecting a chip to plural pulses over time, with each pulse having a different energy content. Thus, the chip is subjected to a first pulse having a first energy content. The energy content of the first pulse is selected at a low value so as only to burn fuzz or chips that are within normal operating tolerances for the equipment that is being monitored. If the chip is fuzz, then it may be burned or displaced by the first pulse. If the chips survives the first pulse, then it is subjected to a second pulse having a second energy content. The second pulse typically has a greater energy content than the first pulse. If the chip is burned or displaced by a particular pulse, then the size of the chip can be determined from the amount of energy required to burn or displace that chip. In the preferred embodiment, the chip is subjected to pulses of ever increasing energy.

BRIEF DESCRIPTION OF THE DRAWINGS

FIGS. 6-9 are waveforms of pulses used to burn away chips of various sizes on a chip detector.

DESCRIPTION OF THE PREFERRED EMBODIMENT

Figure 1:
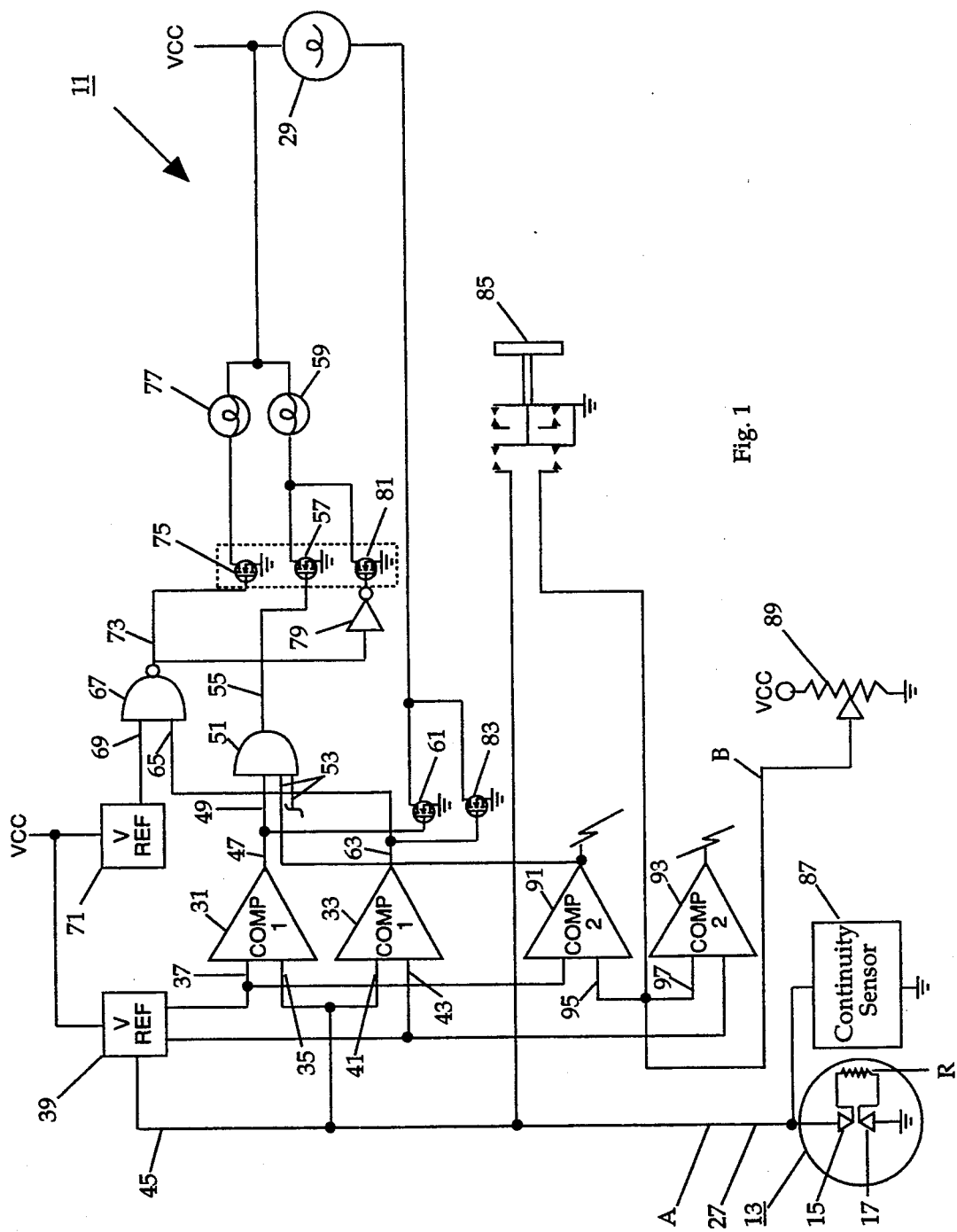
FIG. 1 is an electrical schematic diagram showing the system of the present invention, in accordance with a preferred embodiment.

Referring the FIG. 1, the system 11 of the present invention is shown. The system 11 monitors the status of one or more sensors 13, 89 and also the status of the respective sensor circuit. In the preferred embodiment, the sensor is a chip detector 13, which is an open circuited device. The chip detector 13 has been modified by wiring a resistor R across the open circuit contacts 15, 17.

Figure 2:
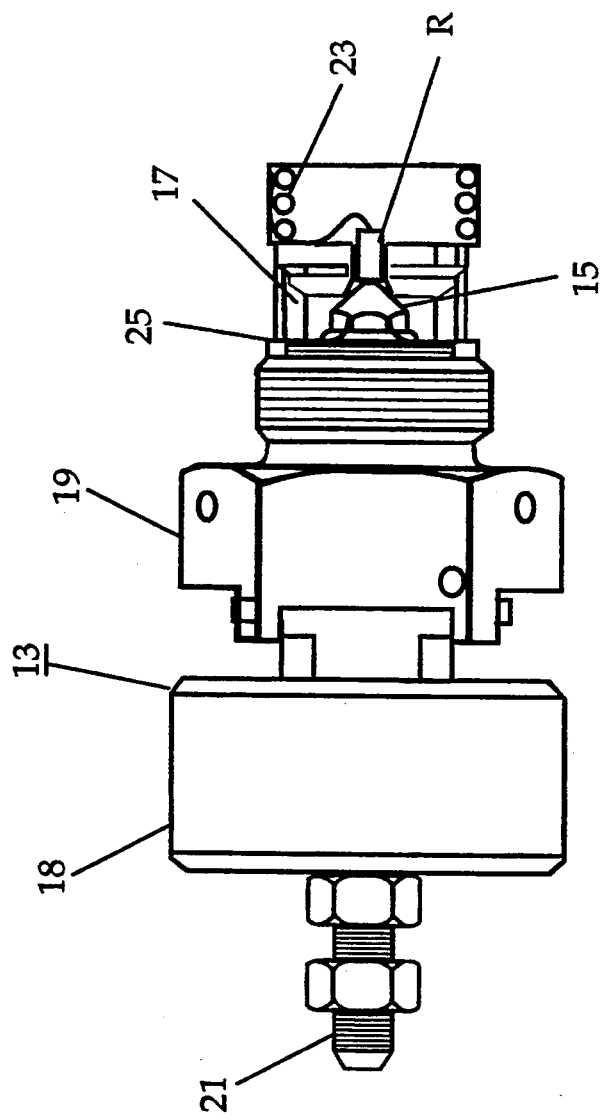
FIG. 2 is a side, partially cut away view, of a chip detector as modified for use in the present invention.

Referring to FIG. 2, the chip detector 13 is shown. The chip detector has a removable plug 18 and a fixed or seat portion 19. The seat 19 is fixed to the transmission housing by threads. The plug 18 can be removed for visual inspection. The plug 18 has the tip contact 15 while the seat has the ground contact 17. The resistor R is located inside of the chip detector seat 19 so that when the chip detector plug 18 is inserted into the seat in the transmission, the tip contact 15 of the plug contacts one end of the resistor R. This tip contact 15 is electrically connected to the terminal 21 on the plug, which receives a wire 27 (see FIG. 1). The other end of the resistor R is connected to the ground contact 17 of the seat, via a coil spring 23 in the seat. This location of the resistor R allows chips to collect in the area 25 between the tip contact 15 and the ground contact 17.

Referring again to FIG. 1, the chip detector 13 is connected via electronics to a warning light 29 located inside of the instrument panel in the cockpit of a helicopter. The warning light 29 is connected to a supply voltage $V_{cc}$. When the electronics and/or the chip detector complete the circuit to ground, the warning light 29 illuminates.

The electronics provide comparators to detect a voltage level above or below a predetermined level. Each channel has a high comparator 31 and a low comparator 33. Thus, for the chip detector channel, the high comparator 31 has one input 35 connected to the tip contact 15 of the chip detector and the other input 37 connected to a reference voltage supply 39. The reference voltage supply 39 is connected to the supply voltage $V_{cc}$. The reference voltage input 37 into the high comparator 31 is set at a first predetermined level (e.g. 3-3.5 V). The low comparator 33 has one input 41 connected to the tip contact 15 of the chip detector and the other input 43 connected to the reference voltage supply 39. The reference voltage input 43 into the low comparator is set at a second predetermined level (e.g. 0.7-1.5 V). The reference voltage supply is also connected to the tip contact through wire 45. This output on wire 45 of the reference voltage supply 39 provides a high voltage to the continuity sensor 87 (which will be explained below). The high voltage is provided through a voltage divider, which utilizes resistor R. Thus, if chips close the chip detector circuit, the high voltage from wire 45 is pulled low.

The output 47 of the high comparator 31 is connected to one input 49 of an AND gate 51. The other inputs 53 of the AND gate 51 are connected to high comparator outputs from the other channels which service other sensors. The output 55 of the AND gate 51 is connected to the gate of a field effect transistor (FET) 57. The source and drain of the FET are connected to an amber light 59 and ground respectively. The amber light 59 is connected to the supply voltage $V_{cc}$. The output of the high comparator 31 is also connected to the gate of a FET 61, which is connected in series to the instrument panel warning light 29 for the chip detector.

The output 63 of the low comparator 33 is connected to one input 65 of a NAND gate 67. The other input 69 of the NAND gate 67 is connected to a reference voltage supply 71, which supplies a third predetermined level (e.g. 5 V) so as to produce a high input. The output 73 of the NAND gate 67 is connected to the gate of an FET 75 that drives a green light 77 by providing a connection to ground. The green light 77 is connected to the supply voltage $V_{cc}$. The output 73 of the NAND gate 67 is also connected to the input of an inverter 79. The output of the inverter 79 is connected to the gate of a FET 81 that drives the amber light 59 by providing a connection to ground. Thus, the amber light 59 is connected to two FETS 57, 81 that are connected to ground in parallel with each other. The output of the low comparator 33 is also connected to a FET 83 that drives the instrument panel warning light 29 by providing a connection to ground. Thus, the instrument panel warning light 29 is connected to two FETS 61, 83, that are respectively driven by the high and low comparators. The two FETS 61, 83 are connected to ground in parallel with each other.

There is also provided a press-to-test button 85 in the cockpit instrument panel. The press-to-test button 85 is normally open, but when pressed by a pilot, it provides a connection to ground for the tip contact inputs 35, 41 of the two comparators 31, 33. The green and amber lights 77, 59 may be physically located within the press-to-test button 85 so as to conserve instrument panel space.

There is also provided a continuity sensor 87 located adjacent to the chip detector 13. The continuity sensor is connected across the chip detector contacts 15, 17. The construction and operation of the continuity sensor 87 is described in Berrier, et al., U.S. Pat. No. 5,045,840, the disclosure of which is herein incorporated by reference. The continuity sensor 87 provides continuity across a chip detector whenever power is applied to the wire 27. Power is applied to the wire 27 by the high voltage on wire 45, whenever the system 11 is powered up. The continuity sensor 87 maintains continuity for a predetermined amount of time, (e.g. 5-10 seconds) and then breaks continuity.

The system 11 of the present invention can service plural channels, with each channel having a sensor. As exemplified in FIG. 1, a first channel A is connected to the open circuit chip detector 13. A second channel B is connected to a sensor 89 that uses a potentiometer. The second channel contains its own high and low comparators 91, 93, a NAND gate (not shown) and two FETS (not shown) for driving the respective instrument panel warning light (not shown). These electronics components of the second channel B are identical in configuration to the electronic components of the first channel A. The outputs of the comparators are connected to the same FETS that drive the green and amber lights 77, 59. Thus, the green and amber lights 77, 59 and their FET drivers 57, 75, 81 are common to all channels. In addition, the AND gate 51 is common to all channels. The press-to-test button 85 is also connected to the non-voltage reference inputs 95, 97 of the comparators 91, 93.

With sensor 89, unlike the chip detector 13, a path to ground through the potentiometer is already provided. The reference voltages provided to the high and low comparators 91, 93 can be the same as in the first channel A, as shown in FIG. 1, or other reference voltages can be provided.

The operation of the system will now be described in general. An illuminated green light 77 indicates that the fault monitoring system 11 is normal. If the sensor is activated and changes voltage (as when the chip detector is provided a path to ground through captured chips), then the warning light 29 comes on and the green light 77 stays on. This indicates that the system is operating normally and that the sensor 13 has been activated.

If an open circuit or high resistance fault is present in channel A, the green light 77 goes off and the amber light 59 and the respective warning light 29 comes on. The warning light allows the pilot to identify which channel has the fault.

The system can be tested by either pressing the press-to-test button 85 or applying power to the continuity sensor 87. This illuminates all of the lights; the green light 77, the amber light 59 and the warning lights (such as 29) located in the instrument panel. Illumination of all lights indicates that the system is operating normally. If the green light fails to come on during a test, then an open circuit or high resistance fault is present in one of the channels. Identification of the channel occurs by ending the test (by releasing the press-to-test button and by waiting for the continuity sensor to turn off) so that the normal channels turn off the respective warning lights. This leaves the affected channel warning light 29 on.

If a fault is indicated by the amber and warning lights, yet the system tests normally (all lights, including the green light 77 come on), then this indicates that there is a problem with the chip detector 13. The chip detector could be out of its hole (that is the plug 18 is not in electrical contact with its seat 19) and transmission fluid may be leaking.

In general, the high comparator 31 is ground seeking, changing state from low to high when a ground is present in the channel. Such a ground can be caused due to activation of the test button 85, the presence of chips in the chip detector 13 or by a grounded wire. The low comparator 33 is high seeking, changing state from low to high when an open circuit or high resistance is present in the channel. Such an open circuit or high resistance can be caused by a broken or loose wire, the chip detector being out of the hole (so that the tip contact 15 no longer contacts the resistor R) or by the chip detector contacts degrading due to corrosion or coking (thereby causing a decrease in the leakage current through resistor R). Resistor R is selected so as to provide a suitable known leakage current. The resistor R, in the preferred embodiment, is 12000 ohms. Specific changes in the leakage current are detected by the two comparators 31, 33.

Now, the operation of the system will be described more specifically. The green light 77 is illuminated to indicate that the system is normal. In a quiescent state, the outputs of the high and low comparators 31, 33 are low. This drives the output of the NAND gate 67 high, which turns on FET 75 and illuminates the green light 77. Also, FET 81 is held open by the inverter, to keep the amber light 59 off.

To test the system, the press-to-test button 85 is pressed, wherein the green light stays on, and the amber light 59 and the warning lights 29 illuminate. Closure of the press-to-test button provides a ground to the inputs 35, 41. The high comparator 31, which is ground seeking, changes its output 47 to high. This high is input to the AND gate 51. Assuming the other channels are free of faults, all of the other channels also provide high inputs into the AND gate. This causes the AND gate 51 to switch high, which closes FET 57 to illuminate the amber light 59. In addition, the high output 47 of the high comparator 31 switches FET 61 on to illuminate the warning light 29. In fact, all of the warning lights for the other channels are illuminated. Thus, when pressing the press-to-test button 85, all of the lights are illuminated to indicate that the system is in working order.

When the press-to-test button is released, the green light 77 stays on and the amber light 59 and the warning lights go off after the continuity sensor 87 turns off.

The same test automatically occurs every time power is first applied to the chip detector 13. Power is applied to wire 27 by turning on the system, so as to energize the reference voltage supply 39, or by releasing the press-to-test button 85 after it has been pressed. When power is applied, wire 27 has a high voltage, which activates the continuity sensor 87. This application of power causes the continuity sensor 87 to provide continuity to ground for a predetermined amount of time (for example 5 to 10 seconds). When continuity is provided, the amber light 59 and the warning light 29 illuminate as when the press-to-test button is pressed. Only those warning lights that are in a circuit with a continuity sensor 87 are illuminated. After the predetermined amount of time has passed, the continuity sensor opens and the amber light and warning light go off.

If a sufficient amount of chips become lodged in the chip detector 13, or if a wire is shorted to ground, then the warning light 29 illuminates to inform the pilot of an activation of the circuit. The chips in the chip detector provide a path to ground. This ground causes the output 47 of the high comparator 31 to go high. The amber light 59 stays off because only one channel is affected and the AND gate 51 stays low.

The operation of the system when a circuit fault is present will now be described. If there is an open circuit or high resistance in Channel A, the system 11 automatically detects this fault. The amber light 59 and the warning light 29 are illuminated, while the green light 77 is turned off. This indicates a fault condition in the channel shown by the specific warning light 29. The low comparator 33 senses the open circuit or high resistance and switches its output 63 high. This illuminates the warning light 29 and also the amber light 59 by way of the NAND gate 67 and the inverter 79. The green light 77 is turned off. This condition will persist until repaired.

When a fault is indicated, the system can be tested by activating the press-to-test button 85. If the fault is between the continuity sensor 87 and the comparators, the green light 77 will stay off. This indicates a loose or broken wire in the channel. However, if the green light 77 comes on, this indicates that the circuit to the continuity sensor 87 is operational, and that the chip detector is presenting the fault condition. The chip detector 13 is either out of the hole or the chip detector has degraded due to contact corrosion or coking. If the chip detector is out of the hole, the transmission fluid could be leaking, a dangerous possibility.

Figure 3A:
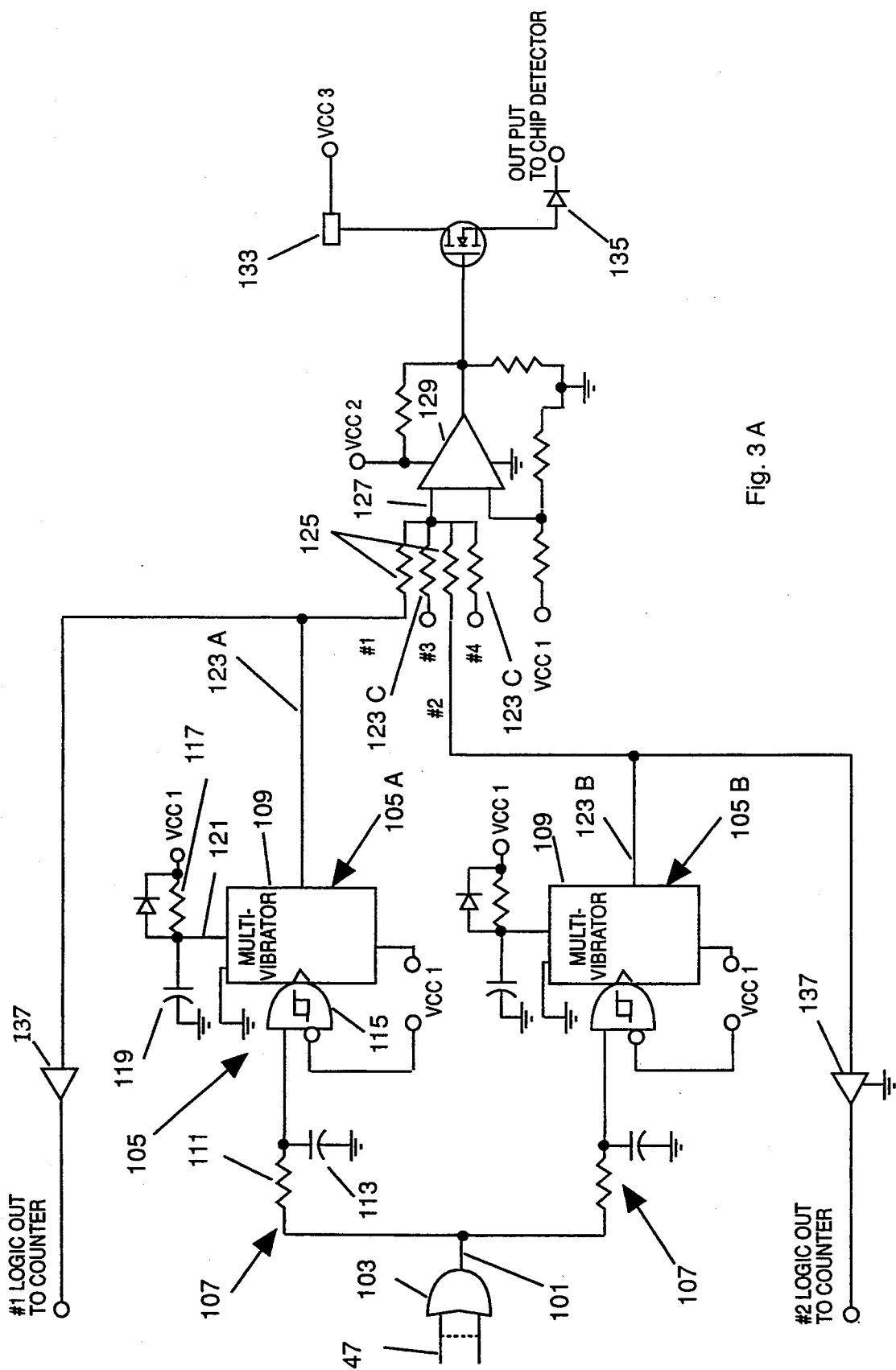
FIGS. 3A and 3B are an electrical schematic diagram, showing the chip monitoring apparatus of the present invention, in accordance with a preferred embodiment.
Figure 3:
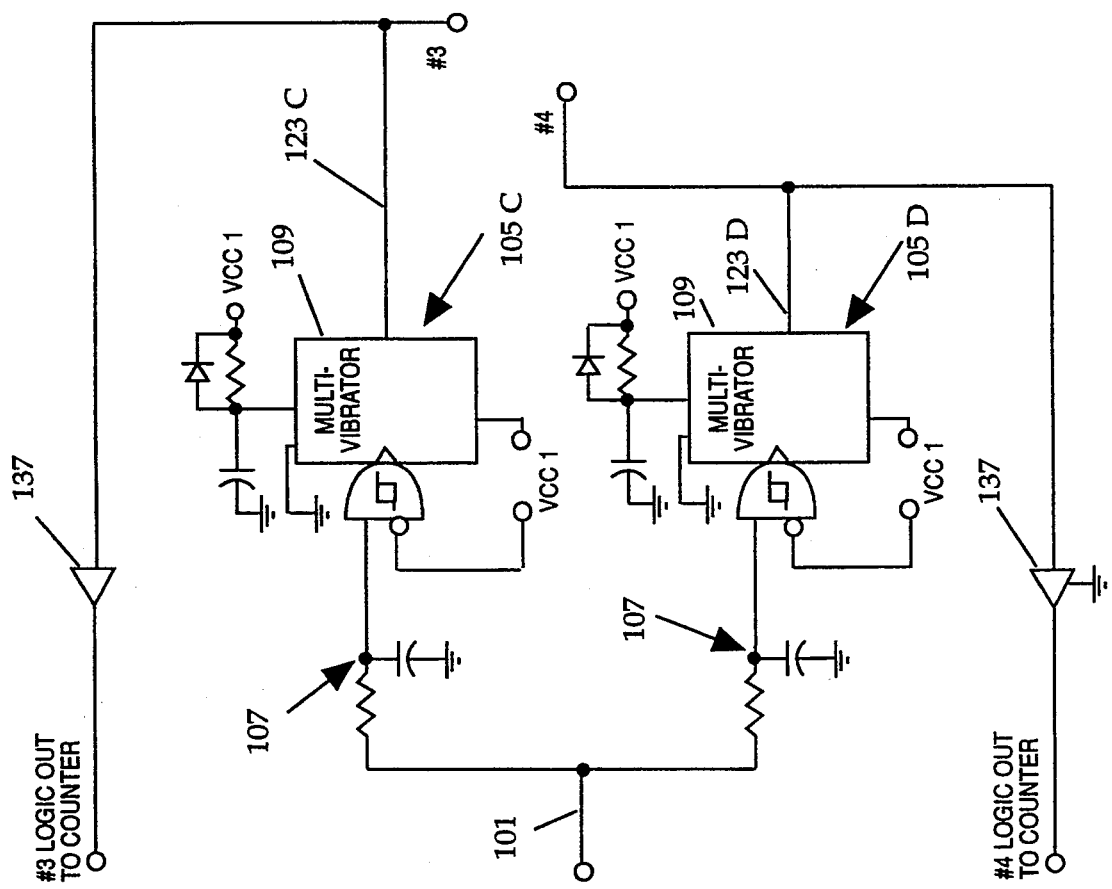
Figure 4:
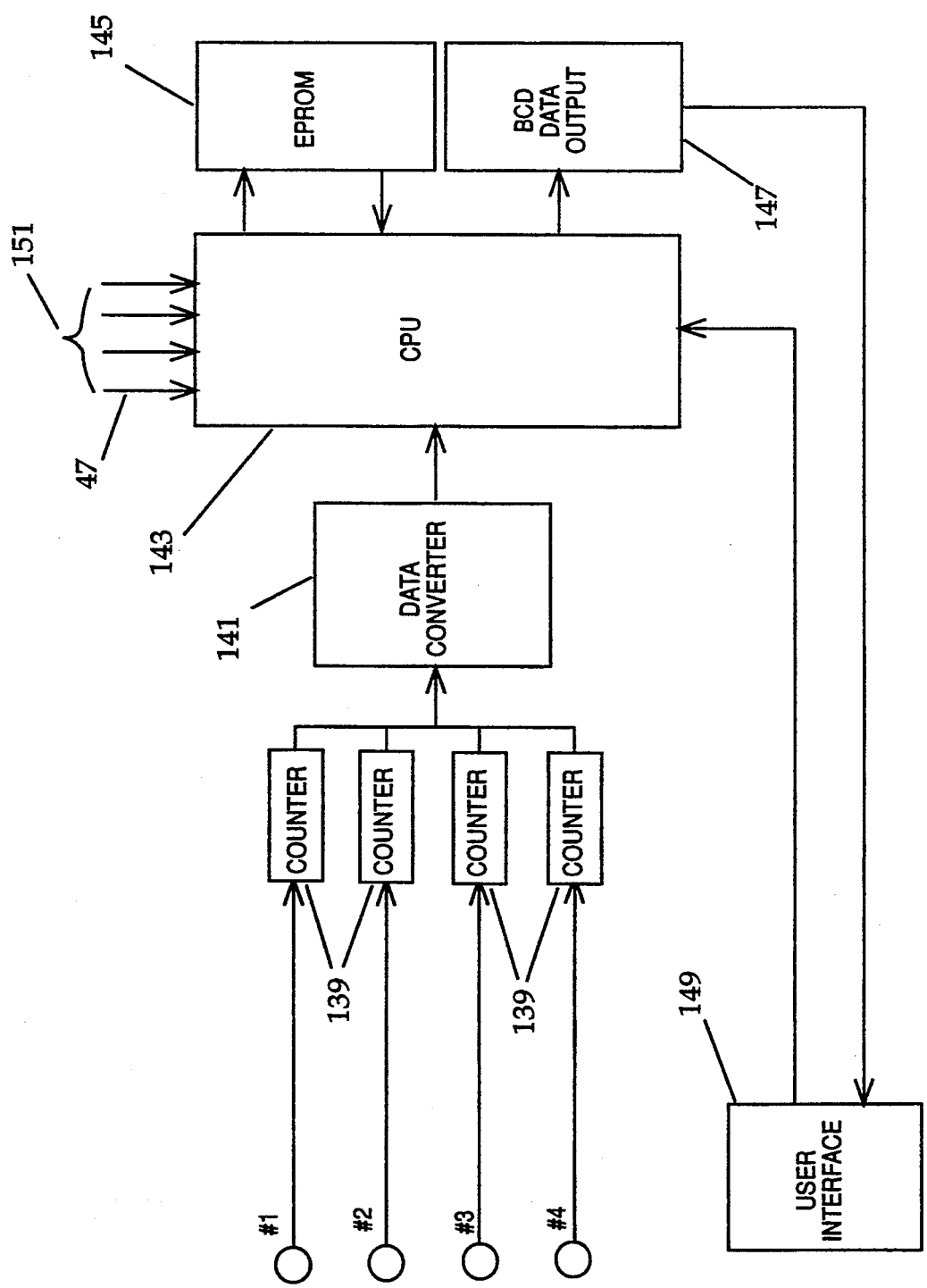
FIG. 4 is a block diagram showing the data recorder of the present invention.
Figure 5:
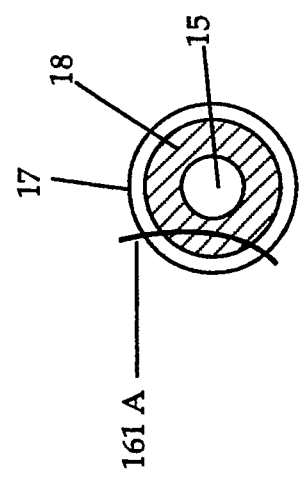
FIGS. 5A and 5B are schematic diagrams respectively showing chip placement on chip detector contacts before and after burn and displacement of the chip.
Figure 5:
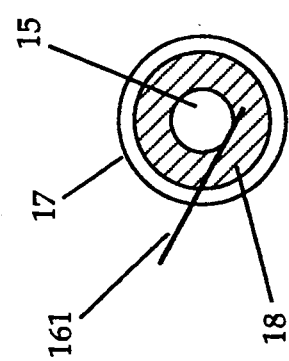

Referring to FIGS. 3A-9 the chip monitoring apparatus will be described. The chip monitoring apparatus, which is shown in FIGS. 3A-4, is used to burn away fuzz (or small chips) from the contacts of a chip detector and to determine the approximate sizes of chips based upon the amount of energy provided to chips. The apparatus is designed to be used in conjunction with the circuit of FIG. 1 and the chip detector of FIG. 2. The chip monitoring apparatus records the information on the sizes of the chips detected. Maintenance personnel or pilots can utilize the information on chip size to determine the air worthiness of the transmission or other piece of equipment that is being monitored. This information provides a history of the operation of the transmission, giving an unprecedented and invaluable look into the operational safety of the transmission.

Referring to FIG. 3A, the input 101 of the chip monitoring apparatus is connected to the output of an OR gate 103. The OR gate has plural inputs, each of which is connected to the output of a high, or ground seeking, comparator of the circuit of FIG. 1. For example, one input is connected to the output 47 of the high comparator 31 of FIG. 1. Other channels having chip detectors or other open circuited devices are connected to the other inputs of the OR gate 103.

The input 101 is connected to plural pulse generators 105 (see FIGS. 3A and 3B). In the preferred embodiment, there are four pulse generator 105A, 105B, 105C, 105D. Each pulse generator 105 has a timer 107 and a one shot multivibrator 109. The timer 107 allows each pulse generator to generate pulses in a coordinated manner with respect to the pulse generators. In the preferred embodiment, the timer 107 is an RC delay network. The resistor 111 is connected in series with the input 101 and the capacitor 113 is connected to ground. The amount of delay is set by selecting the time constant of the RC network 107. The output of the RC network is connected to a noninverting input of a Schmitt trigger 115 that is incorporated into the multivibrator 109. The multivibrator 109 has a resistor 117 and a capacitor 119 connected to an input 121, which components 117, 119 control the width of the pulse that is produced by the multivibrator. The output 123A, 123B, 123C, 123D of each multivibrator is connected, through respective resistors 125, to an input 127 of a summing amplifier 129, which sums the outputs from all of the pulse generators. The output of the summing amplifier 129 is connected to the gate of a power field effect transistor (FET) 131. The source and drain of the FET 131 are connected to a supply voltage VCC and to the chip detector 13 via wire 27 (see FIG. 1). The comparators 31, 33, 91, 93 in FIG. 1 can be protected from the fuzz burning pulse by diodes. Connected in series with the supply voltage VCC is a current limiter 133, which is a thermistor. The thermistor acts as a circuit breaker and breaks the circuit if the current exceeds a predetermined magnitude. Thus, the chip detector circuit is protected against pulses that contain too much energy. The output to the chip detector is protected with a diode 135.

The output 123A, 123B, 123C, 123D of each multivibrator 109 is also connected to the input of a respective buffer 137. The output of each buffer 137 is connected to the input of a respective counter 139 (see FIG. 4). The output of each counter 139 is connected to the input of a data converter 141. The output of the converter is connected to an input of a central processing unit (CPU) 143. The CPU 143 is connected to nonvolatile memory 145 in the form of an EPROM, and also to an output interface 147, in the form of a data output device. The output of the output interface 147 is connected to a user interface 149 that is located in the cockpit of a helicopter, in view of the pilot. The user interface 149 includes a display to output data and a key pad to input data. The CPU 143 has other inputs 151 as well. These inputs are connected to the inputs of the OR gate 103 in FIG. 3A. For example, one CPU input is connected to the output 47 of the high comparator 31. This allows the CPU to identify which channel or sensor is being affected by chips.

The operation of the chip monitor will now be described. When the chip detector 13 is installed into a transmission, its contacts 15, 17 are exposed to oil circulating in the transmission. Referring to FIG. 5A, a magnet 18 is provided in the chip detector 13, between the two contacts 15, 17. The magnet 18 attracts chips that are circulating in the oil. When a chip 161 is captured by the magnet, if it is large enough, it will make contact with both contacts. 15, 17, thereby shorting across the contacts and completing the circuit. (If the chip is not large enough to touch both contacts, then the chip remains in place on the magnet, awaiting an accumulation of more chips to short across the contacts 15, 17.)

Referring to FIG. 1, the connection-to-ground caused by the chip is detected by the high comparator 31. The output of the high comparator 31 changes to high. This high output is routed through the OR gate 103 (see FIG. 3A) and thence to the input 101 to all of the pulse generators 105A, 105B, 105C, 105D. When the input 101 goes high, the timers 107 begin to charge the capacitors.

The timer 107 of each pulse generator can be programmed to provide the desired coordination between the pulse generators. Programming occurs by selecting a resistor 111 and a capacitor 113 to provide the desired time constant. For example, in the preferred embodiment, the timer 107 of pulse generator 105A provides a 500 ms delay, the timer of pulse generator 105B provides a 1000 ms delay, the timer of pulse generator 105C provides a 1500 ms delay and the timer of pulse generator 105D provides a 2000 ms delay. In addition to programming when each pulse generator will be used, each pulse generator can be programmed to provide pulses of selected widths. Pulse widths are programmed by selecting the resistor 117 and capacitor 119 to provide the desired time constant to the multivibrator. For example, pulse generator 105A provides a pulse of 35 ms duration, pulse generator 105B provides a pulse of 70 ms, pulse generator 105C provides a pulse of 100 ms, and pulse generator 105D provides a pulse of 150 ms duration.

When the input 101 goes high, the capacitors 113 in the timers 107 begin charging. After 500 ms, the timer of pulse generator 105A produces a high input to the Schmitt trigger 115. This causes the multivibrator 109 of pulse generator 105A to produce a pulse on its output 123A. This pulse is routed through the summing amplifier 129 to the FET 131, causing the FET to conduct. Energy from the power supply VCC is thus connected to the chip detector 13. The current limiter maintains the energy pulse in the preferred embodiment to 10 volts, 10 amps. The first pulse is 35 ms in duration, after which the output 123A of the multivibrator goes low, thereby turning off the FET 131.

Thus, pulse generator 105A will provide the first energy pulse to the chip. If the chip is still in place across the contacts 15, 17 after being subjected to the first pulse, then after 1000 ms from the detection of the chip, the timer of pulse generator 105B will cause pulse generator 105B to provide the second energy pulse to the chip. The second energy pulse contains more energy than the first energy pulse, because the second energy pulse has a longer duration. If the chip is still in place after being subjected to the second pulse, then, after a delay of 1500 ms, pulse generator 105C will provide the third energy pulse to the chip. If the chip is still in place after being subjected to the third pulse, then, after a delay of 2000 ms, pulse generator 105D will provide the fourth energy pulse to the chip. In this manner, the pulse generators are automatically coordinated with each other in providing energy pulses to the chip in a stepwise manner. The chip is subjected to plural pulses of energy over time, with the energy content of each pulse increasing over time. The pilot of the aircraft is unaware of these activities until notified that a large chip is present, as described below.

Referring to FIGS. 5A and 5B, the energy pulse is routed through the chip 161. As current flows through the chip, resistive heating causes the chip to diminish and deform. In FIG. 5A, the chip 161 is shown before it has been subjected to an energy pulse. FIG. 5B shows the chip 161A after being subjected to an energy pulse. The chip 161A has curled and been displaced away from contact 15. In most cases, the displacement of the chip 161A is sufficient to place the chip back into circulation in the oil system, where the chip is then removed by an oil filter. Breaking electrical contact with the contact 15 removes the short across the chip detector. This causes the output of the high comparator 31 in FIG. 1 to go low, and thereby causes input 101 (FIGS. 3A, 3B) to go low. When input 101 is low, the capacitors 113 in the timers 107 begin to discharge, effectively disabling the pulse generators. Thus, no more pulses are generated.

When the energy pulse (in the form of electrical current) is routed through the chip 161, a magnetic field is developed around the chip as a result of the current flowing through the chip. This magnetic field is oriented at 90 degrees with respect to the magnetic field of the chip detector magnet 181. Thus, the energy pulse not only heats and burns the chip, but produces a magnetic field that is repulsed by the chip detector magnet 18, further aiding the displacement of the chip from the contacts 15, 17.

In the preferred embodiment, the energy pulses of all of the pulse generators are square pulses of the same voltage and amperage. This simplifies the determination of the size of the chip, which will be explained in more detail below.

The chip monitor can be connected to plural chip detectors. The inputs to the chip eliminator have already been described. The output to the FET 131 is connected to all of the chip detectors. The particular chip detector that has the shorting chip will draw the energy pulse, because the other chip detectors will present open circuits.

Every time a pulse generator produces a pulse, that pulse is counted by the respective counter 139 (see FIG. 4). The CPU 143, which has a clock, records the pulses produced by each pulse generator over time in its memory 145. In addition, the CPU records the number of and duration of pulses provided to each chip detector. This information is obtained by correlating the inputs 151 to the inputs from the counters. Thus, the CPU records a full history of each chip detector.

In addition, the CPU 143 provides an indication on the user interface 149. A threshold for each channel can be programmed into the CPU. The threshold can be a predetermined pulse width. The CPU compares the pulses from the specific pulse generators and the specific channels to the particular threshold for a channel. If the threshold has been met or exceeded, an indication is given on the display in the user interface 149. For example, if the threshold pulse width is 150 ms, and if pulse generator 105D is utilized to produce a pulse, then, the CPU 143 indicates that this threshold has been met by providing an indication on the user interface. This informs the pilot that a large chip was discovered in the chip detector. The number and energy content of the pulses is determined by the particular piece of equipment being monitored. For example, the Allison 250-C20 turbine allows the elimination of chips up to 0.032 square inches in cross-sectional area. Therefore, the threshold would be set to provide an indication if a chip larger than 0.032 square inches is detected. Another threshold that can be programmed is a specified number of pulses of a specified width within a specified duration. If the CPU detects this threshold, then an indication is given on the user interface. The indication can be a number code, which specifically identifies the threshold that has been met or exceeded in the .channel on which it has occurred. A user can also operate the user interface to obtain access to the information stored by the CPU in its memory.

Figure 6:
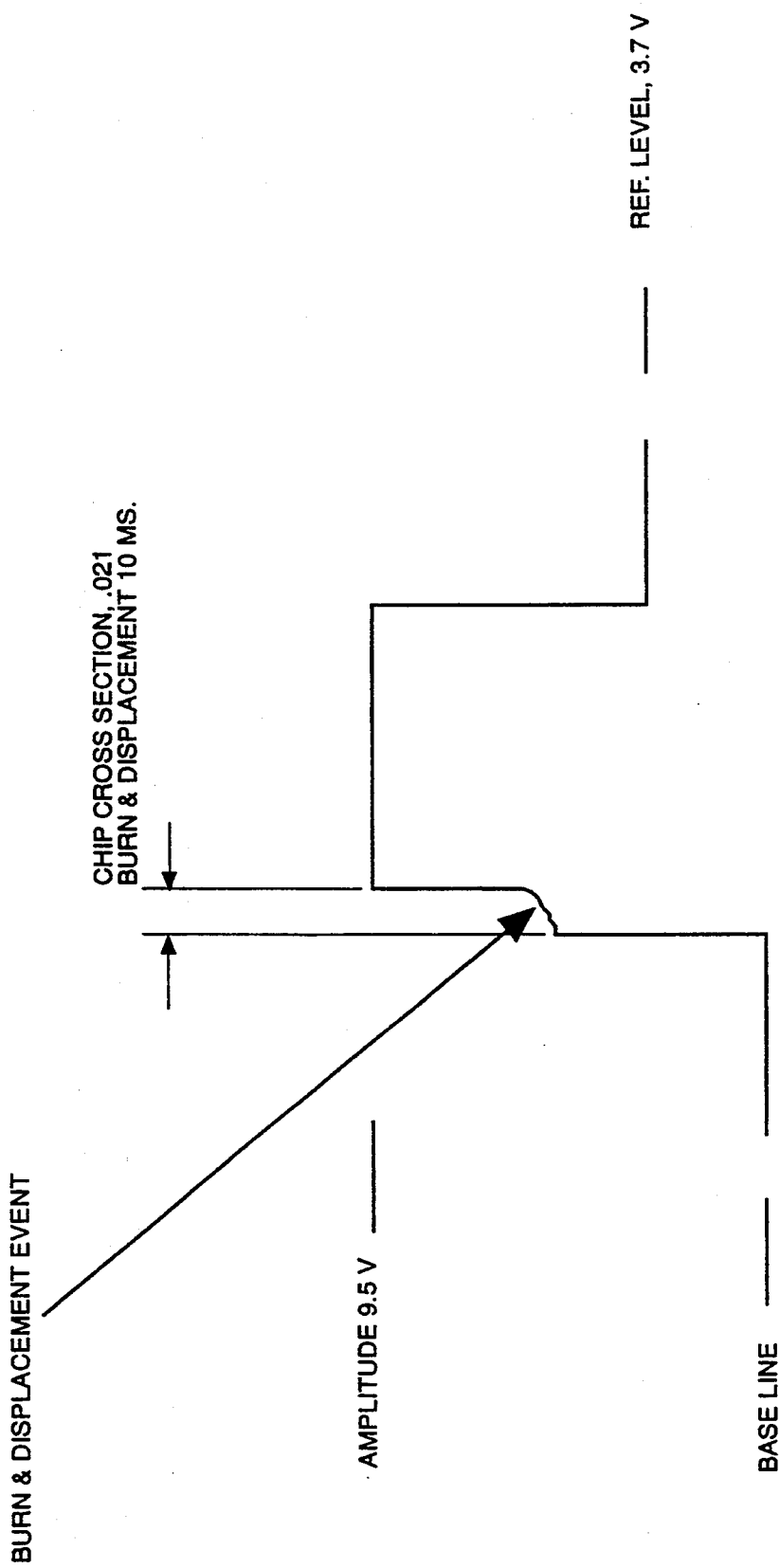

The chip monitoring apparatus can determine the size of chips. Referring to FIGS. 6–9, there are shown waveforms that illustrate the burning of chips. In the Figs., a pulse of 70 ms duration was used and the chips were immersed in transmission oil. In FIG. 6, the chip was burned and displaced away from the chip detector contacts in about 10 ms. During the burning, the voltage increases thereby indicating that the resistance increases as the chip heats up. After 10 ms, the voltage increases to full voltage, indicating an open circuit and the displacement of the chip from at least one contact of the chip detector.

Figure 7:
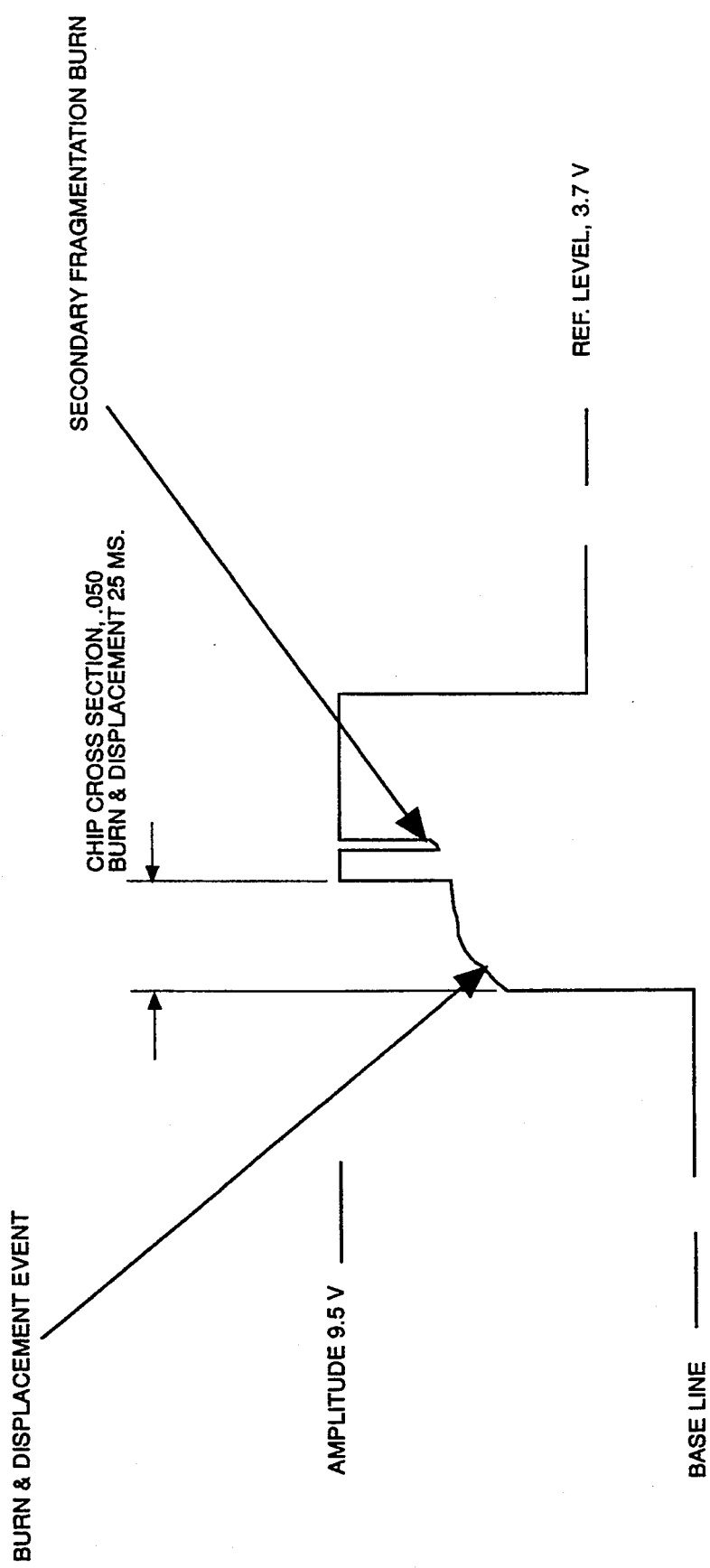

The cross-sectional area of the chip burned in FIG. 6 was about 0.021 square inches. The larger the cross-sectional area of the chip, the more energy that is required to burn and displace the chip. This is because the chip has more mass that must be resistively heated. In FIG. 6, the pulse begins at a base line of 0 V, indicating a short across the chip detector contacts. After the end of the pulse, the voltage across the chip detector contacts, which are now open due to the burning of the chip, returns to a reference level (3.7 V in the preferred embodiment). This reference level is due to the leakage resistance R (see FIG. 1) across the chip detector contacts. In FIG. 7, the chip was burned and displaced in about 25 ms. The cross-sectional area of the chip in FIG. 7 was about 0.050 square inches. FIG. 7 also shows the occurrence of a secondary burn. This secondary burn was caused by a secondary fragment. The secondary fragment burn occurred in under 10 ms. In FIG. 8, the chip had a cross-sectional area of about 0.095 square inches. In the first 55 ms of the pulse, the chip is burned and fragmented. One of the fragments returns, almost instantaneously to the chip detector contacts, causing a rise in voltage and another resistive heating. By the end of the pulse, the chip fragment is still in contact with the chip detector contacts. This causes the CPU to initiate a warning on the user interface. In FIG. 9, the chip is too large to be burned by the pulse. Therefore, FIG. 9 shows a short across the chip detector contacts for the duration of the pulse.

A look up table is created and stored in the EPROM 145. The look up table, which is empirically created from data such as that described above, is used to determine the size of the chip being burned. For example, if the chip survives a 35 ms pulse but does not survive a 70 ms pulse, the apparatus determines that the chip size is between 35 mils and 100 mils. If the chip survives a 70 ms pulse, but not a 100 ms pulse, then the apparatus determines that the chip size is between 100 mils and 700 mils. If the chip survives a 100 ms pulse but not a 150 ms pulse, then the apparatus determines if the chip size is between 700 mils and 1000 mils.

Although the invention has been described as providing plural pulses of different energies using a pulse generator for each pulse width, energy pulses can be generated with other arrangements. For example, pulse generators can be ganged together and their pulses temporally blended or amplitude blended. Also, the resolution in determining chip size can be varied by either increasing or decreasing the differences in energy of the pulses. For example, if a higher resolution was desired in determining chip size, the sequence of pulses could increase by 25 ms. Thus, a first pulse would have a first duration of 25 ms, followed by a second pulse having a duration of 50 ms, followed by a third pulse having a duration of 75 ms, and so on.

Although the drawings have shown the energy pulses used to burn fuzz as being square pulses, other types of energy shapes could be used. For example, a more rounded pulse of energy could be used to burn away fuzz.

Although the present invention has been described with reference to helicopters, it can be used in other electrical systems as well.

The foregoing disclosure and the showings made in the drawings are merely illustrative of the principles of this invention and are not to be interpreted in a limiting sense.

I claim:

1. An apparatus for eliminating chips from a chip detector, comprising:
   a) means for detecting when a chip is in said chip detector;
   b) means for producing plural pulses in response to said means for detecting when a chip is in said chip detector, said plural pulses including a first pulse and a second pulse, with said first pulse having a different energy content than said second pulse, said means for producing plural pulses comprising timing means for causing the production of said first pulse first and then for causing the production of said second pulse if said chip is still in said chip detector after said first pulse, said means for producing plural pulses having an input that is connected to said means for detecting when a chip is in said chip detector and an output that is connected to said chip detector.

2. The apparatus of claim 1 further comprising means for recording the pulses that said chip is subjected to, said means for recording being connected to said means for producing plural pulses.

3. The apparatus of claim 1 wherein said means for detecting when a chip is in said chip detector further comprises a ground seeking comparator.

4. The apparatus of claim 1 wherein said means for producing plural pulses further comprises means for varying durations of said pulses such that said first pulse has a first duration and said second pulse has a second duration.

5. The apparatus of claim 1 wherein said timing means further comprises means for delaying the production of said first and second pulses.

6. The apparatus of claim 1 further comprising means for determining the size of said chip based upon the energy content of said pulses that are produced.

7. The apparatus of claim 6 further comprising means for providing an indication that said chip is larger than a predetermined size.

8. The apparatus of claim 1 wherein said means for producing plural pulses further comprises means for producing square pulses.

9. The apparatus of claim 1, further comprising:
   a) means for recording the pulses that said chip is subjected to, said means for recording being connected to said means for producing plural pulses;
   b) said means for detecting when a chip is in said chip detector further comprises a ground seeking comparator;
   c) said means for producing plural pulses further comprises means for producing square pulses and for varying durations of said pulses such that said first pulse has a first duration and said second pulse has a second duration;
   d) said timing means further comprises means for delaying the production of said first and second pulses;
   e) means for determining the size of said chip based upon the energy content of said pulses that are produced;
   f) means for providing an indication that said chip is larger than a predetermined size.

10. The apparatus of claim 1 wherein:
    a) said timing means further comprises a first resistor and capacitor network and a second resistor and capacitor network;
    b) said means for producing plural pulses further comprises a first one shot multivibrator having an input connected to said first resistor and capacitor network and a second one shot multivibrator having an input connected to said second resistor and capacitor network.

11. An apparatus for determining the size of chips in a chip detector, comprising:
    a) means for producing plural pulses in response to the presence of a chip in said chip detector, said plural pulses including a first pulse and a second pulse, with said first pulse having a different energy content than said second pulse, said means for producing plural pulses comprising timing means for causing the production of said first pulse first and then for causing the production of said second pulse if said chip is still in said chip detector after said first pulse, said means for producing plural pulses having an input that is connected to a means for detecting when a chip is in said chip detector and an output that is connected to said chip detector;
    b) means for determining the size of said chip based upon the energy content of said pulses that are produced.

12. The apparatus of claim 11 further comprising means for recording the pulses that said chip is subjected to, said means for recording being connected to said means for producing plural pulses.

13. A method for eliminating and monitoring the presence of chips in a chip detector, comprising the steps of:
    a) detecting when a chip is in said chip detector;
    b) subjecting said chip to a first pulse of energy and determining if said chip has suffered burning or displacement from said chip detector as a result of said first pulse;
    c) if said chip has not suffered burning or displacement as a result of said first pulse, then subjecting said chip to a second pulse of said energy that has a different amount of energy than said first pulse of energy and determining if said chip has suffered burning or displacement as a result of said second pulse;

d) determining the approximate size of said chip from the amount of energy required to burn or displace said chip.

14. The method of claim 13 further comprising the step of recording the pulses that said chip is subjected to.

15. The method of claim 14 further comprising the step of providing an indication if said chip is larger than a predetermined size.

16. A method for eliminating a chip in a chip detector, comprising the steps of:

a) subjecting said chip to a first pulse of energy and determining if said chip has suffered burning or displacement from said chip detector as a result of said first pulse;

b) if said chip has not suffered burning or displacement as a result of said first pulse, then subjecting said chip to a second pulse of said energy that has a different amount of energy than said first pulse of energy.

* * * * *